(12) United States Patent
Deck et al.

(10) Patent No.: US 8,521,491 B2
(45) Date of Patent: Aug. 27, 2013

(54) CORRECTION OF CHEMICAL IMAGE COLLECTED USING ATR THROUGH GERMANIUM HEMISPHERE

(75) Inventors: Francis J. Deck, Madison, WI (US);
Koichi Nishikida, Fitchburg, WI (US);
Federico Izzia, Middleton, WI (US)

(73) Assignee: Thermo Electron Scientific Instruments LLC, Madison, WI (US)

( * ) Notice: Subject to any disclaimer, the term of this patent is extended or adjusted under 35 U.S.C. 154(b) by 96 days.

(21) Appl. No.: 13/084,261

(22) Filed: Apr. 11, 2011

(65) Prior Publication Data

US 2012/0259599 A1    Oct. 11, 2012

(51) Int. Cl.
G06G 7/48    (2006.01)
(52) U.S. Cl.
USPC .................................................. 703/6; 703/2
(58) Field of Classification Search
None
See application file for complete search history.

(56) References Cited

U.S. PATENT DOCUMENTS 4,425,504 A * 1/1984 Turnbull et al. .............. 250/353
7,496,220 B2 * 2/2009 Izzia et al. .................... 382/128

OTHER PUBLICATIONS

Sommer et al., "Attenuated Total Internal Reflection Infrared Mapping Microspectroscopy Using an Imaging Microscope", Applied Spectroscopy, vol. 55, Issue 3, 2001, pp. 252-256.*
Nunn et al., "Advanced ATR Correction Algorithm", Thermo Fisher Scientific Inc., Application Note: 50581, 2008, 4 pages.*

* cited by examiner

Primary Examiner — Omar Fernandez Rivas
Assistant Examiner — Herng-Der Day
(74) Attorney, Agent, or Firm — Michael C. Staggs (57) ABSTRACT

A method and corresponding apparatus provide correction of chemical images collected with a germanium hemisphere ATR microscope. A model is developed for rays passing through a simulated germanium (Ge) hemisphere attenuated total reflection (ATR) microscope. The model determines a data set for rays reaching the detector plane. Movement of the hemisphere is simulated along a first axis between each data set determination. A calculated background spectrum is produced by multiplying the percentage of rays by a background spectrum to produce a calculated background spectrum. A real Ge hemisphere ATR microscope having parameters that substantially match those of the simulated Ge hemisphere microscope is then used to collect a chemical image of a sample that is in contact with the Ge hemisphere. The collected image is then corrected to produce a corrected chemical image.

20 Claims, 6 Drawing Sheets

CORRECTION OF CHEMICAL IMAGE COLLECTED USING ATR THROUGH GERMANIUM HEMISPHERE

BACKGROUND OF THE INVENTION

1. Field of the Invention

The present invention relates to attenuated total reflection (ATR) infrared chemical imaging, and more specifically, it relates to method for correcting the image collected using ATR through a germanium hemisphere and one dimensional linear array detector.

2. Description of Related Art

The conventional ATR infrared chemical imaging system utilizing a Ge hemisphere provides chemical information abstracted in the form of 2D or 3D color graphics from the infrared spectra of heterogeneous samples. It obtains infrared spectra from a wide area of a sample from square segment-to-segment areas with a regular segment size in 2 dimensional directions, using a Fourier transform infrared spectrometer (FT-IR) combined with an optical microscope. Instead of using one detector, a one or two dimensional array detector obtains infrared spectra from multiple positions in order to shorten the measurement time. Contents of certain infrared information of every sample segment are converted to a false color and displayed as a full color graph.

Often, infrared ATR imaging systems use a Ge hemisphere to focus the infrared incident beam at the sample position, so that the incident beam is focused at the sample and the infrared beam is totally reflected back from the sample-Ge boundary. The reflected beam is detected by a detector or a linear or 2 dimensional array detector. The use of an array detector reduces the required measurement time because an array detector is composed of multiple detectors. The reflected beam carries the spectral information of the sample. The infrared Ge ATR imaging technique is a popular technique to study fine structures that have a size that is on the order of a few micron, because the refractive index of Ge (n=4) provides additional magnification above the nominal magnification of infrared microscopes. For instance, if an infrared microscope has adequate sensitivity to obtain spectra from a small area such as a 10×10 micron area, the Ge ATR technique may enable the collection of spectra from areas such as a 2.5×2.5 micron sample area. Thus, instead of generating a chemical image of a sample by composing it with 10 micron portions of the sample area, it is possible to obtain the chemical image by stitching observed data for 2.5 micron steps. With the anticipation of this high resolution ability, thin adhesive layers of polymer laminate films, where each film is about 4 microns thick, have been analyzed and displayed as chemical images. There are, however, at least three major problems in this technique as discussed below.

Figure 1A:
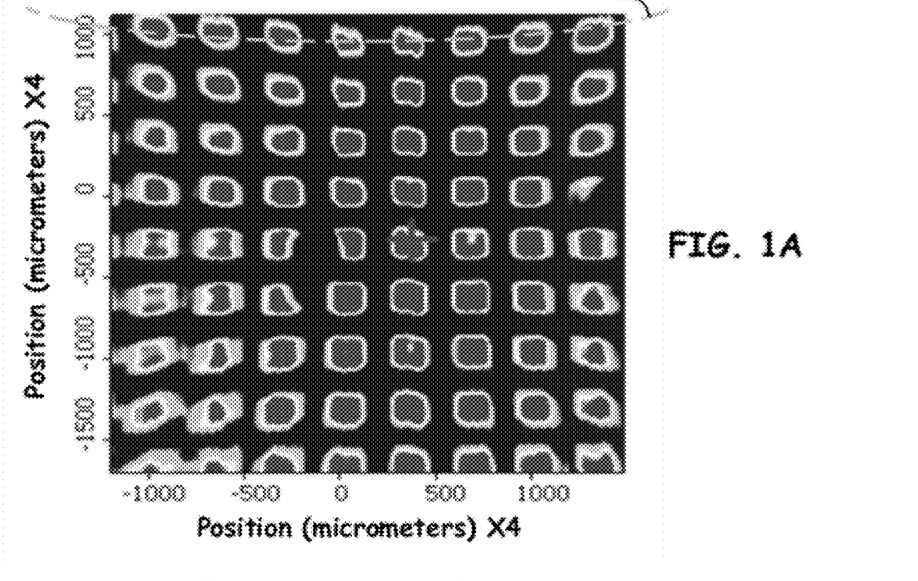
FIG. 1A shows pincushion distortion observed in a Ge hemisphere imaging display.
Figure 1B:
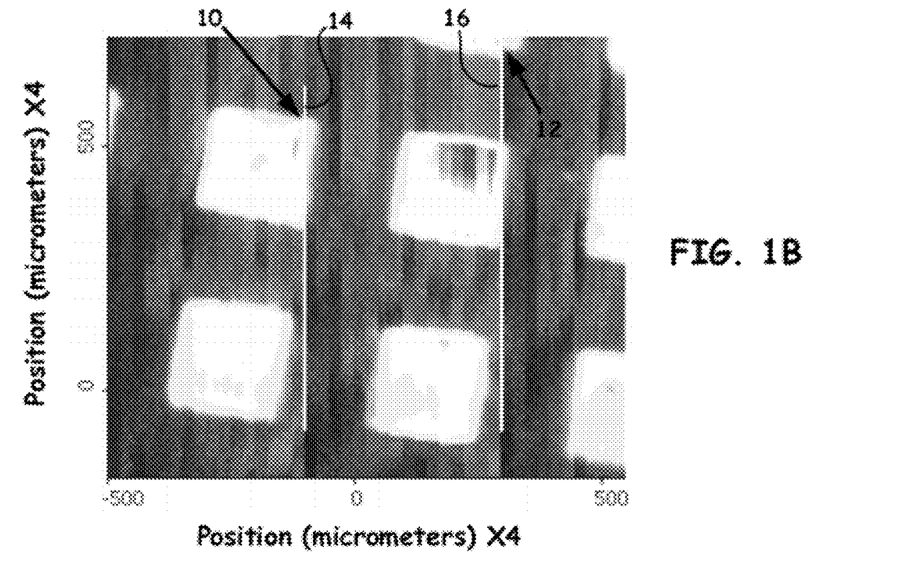
FIG. 1B shows observed discontinuities in a Ge ATR imaging display and further delineates the boundaries in a 16 pixel detector array.

By utilizing the Ge hemisphere as an additional lens in an infrared microscope system, spectroscopic measurements are affected by optical aberrations and distortion. Ge ATR imaging measurements show significant pincushion type distortion in displayed chemical images. FIG. 1A shows a chemical image of a sample prepared as a regular 2-dimensional array of squares. The sample, to illustrate the workings of the embodiments herein, is a polyethylene terephthalate film embossed with a regular pattern. The dotted line denoted by the reference character 101 shows the degree to which the upper row of squares is distorted by a Ge hemisphere ATR technique. This effect, as known to those of ordinary skill in the art of optics, resembles pincushion distortion. However, the distortion typically provided Ge hemisphere ATR analysis is not necessarily axially symmetric the optical system often includes off-axis elements. The blurred images of square objects in the left and right sides of bottom corners in FIG. 1A reveals the presence of additional aberrations. Further detailed studies of small areas show the abrupt changes in distortion when an example Ge/sample unit is moved by, for example, a distance of 16 pixels along the x-axis, i.e., the direction of the long axis of the array, as shown in FIG. 1B. The discontinuities, as illustrated by arrow 10 and arrow 12 in FIG. 1B, appear every 16 pixels as distinguished by denoted line 14 and denoted line 16. All those distortions give rise to an incorrect chemical image of the sample.

Figure 2A:
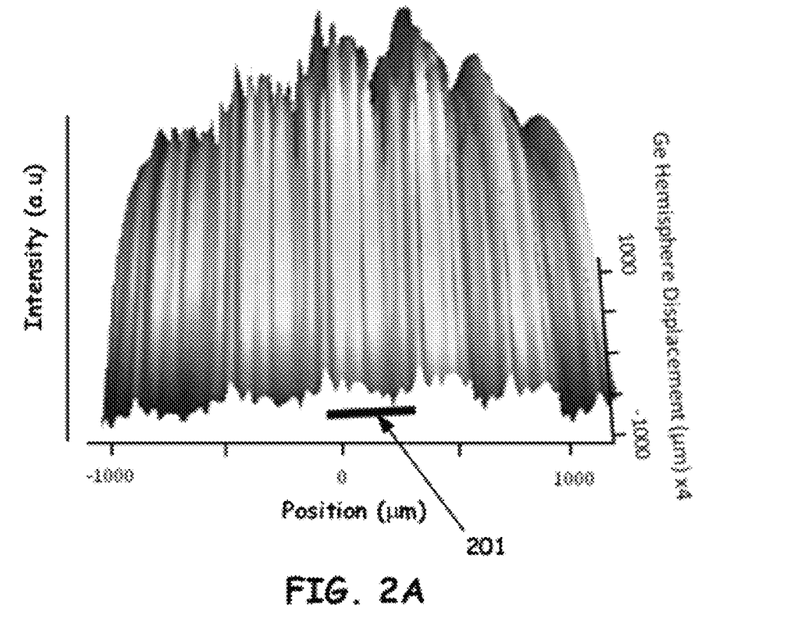
FIG. 2A shows an overall optical throughput image.
Figure 2B:
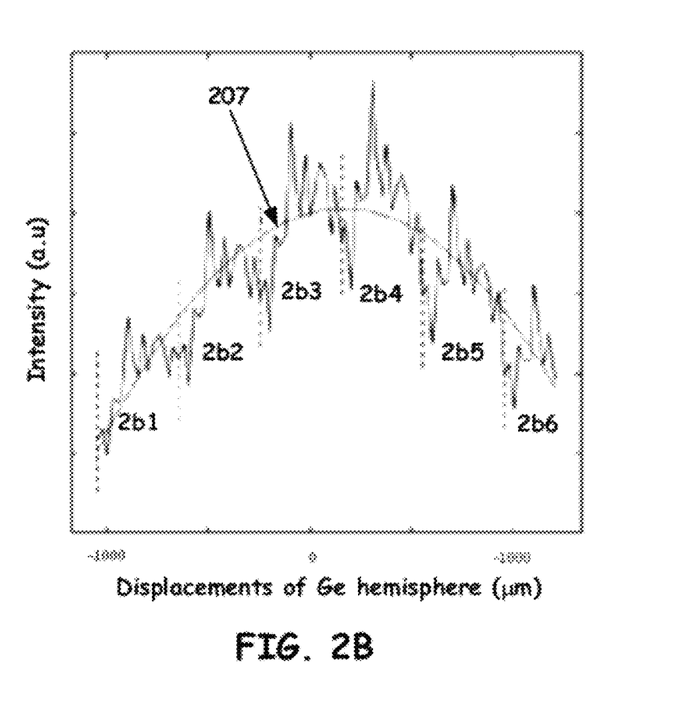
FIG. 2B shows energy values along an x direction at y=0 and a best fitted quadratic equation for the image of FIG. 2A.
Figure 3A:
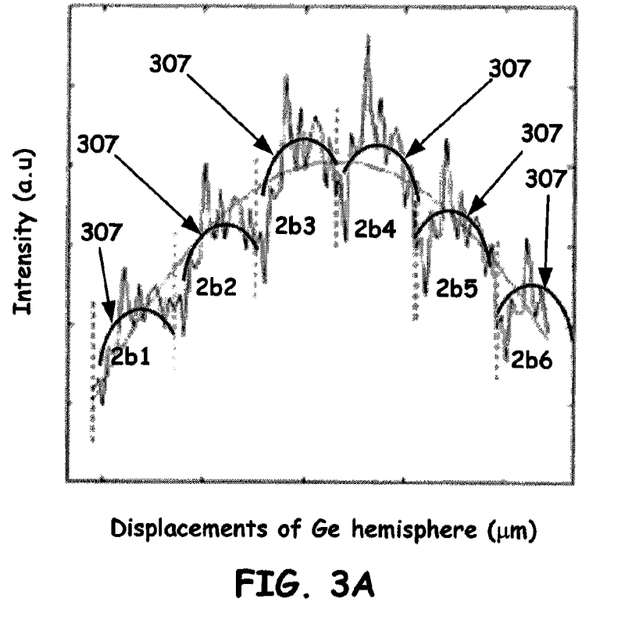
FIG. 3A shows the quadratic energy distribution in six segments of energy distributions of the image of FIG. 2A.
Figure 3B:
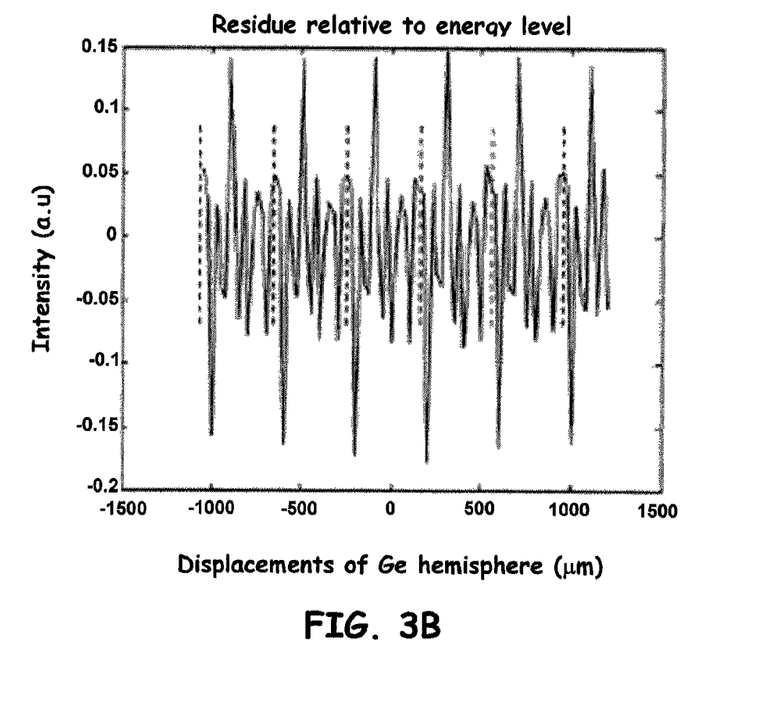
FIG. 3B shows the deviation of the energy level of each of the 16 pixels at different Ge positions from the fitted energy levels, representing pixel sensitivities.

Even when a Ge hemisphere is located in the center of the infrared beam, maintaining the optical symmetry to provide efficient infrared beam throughput is different from sample segment-to-segment with each segment being a desired measurement point. In addition, when the Ge hemisphere and the paired sample are moved together to change the measurement locations, loss of optical symmetry often further changes optical throughput. FIGS. 2A, 2B and FIG. 3A and FIG. 3B are thus provided to illustrate such typical changes in ATR optical throughput. In particular, the optical throughput of an entire microscope and Ge hemisphere system was measured as single beam map for a sample area of 3.2 mm(x)×4 mm(y). FIG. 2A shows an example plot of overall optical throughput as a measurement of infrared intensity of an individual segment at 2,000 $cm^{-1}$. These data were collected in 6 passes of a 16-element array detector across the sample. The dark bar 201 shown in FIG. 2A is provided to illustrate the approximate width of the utilized array detector, and represents the width of a single pass. In essence, FIG. 2A illustrates the triple dependence of optical throughput of such a system on: 1) Position along the array detector; 2) Displacement of the Ge hemisphere in the direction of the array detector; 3) Displacement of the Ge hemisphere in the direction perpendicular to the array detector. FIG. 2B shows a corresponding plot of the cross section of the graph shown in FIG. 2A. Regions $2b1$-$2b6$, separated by dashed lines, show the 6 passes of the detector. Denoted line 207 shows an overall quadratic dependence of intensity with position along the axis of the detector. FIG. 3A shows the same cross section, with the regions $2b1$-$2b6$ again shown separated by dashed lines, and further illustrates a quadratic fitted dependence via the denoted fits 307 along the correlated detector widths itself. FIG. 3B shows the same cross-section, with the regions $2b1$-$2b6$ once again shown separated by dashed lines, after both quadratic functions is removed, leaving the sensitivity of individual pixels as the only remaining source of variation. Since the IR spectrum must be calculated as single beam spectra of sample divided by matched incident beam, measurements of a sample map and an incident beam map are recommended. This requires long measurement times compared with usual transmission or reflection measurements, in which incident beam spectra are taken only at one position. In addition, regions of the map with low throughput results in a deleterious degradation of signal-to-noise due to decreased intensity of the incident beam map.

The incident angle is different from sample segment to sample segment. Different incident angles result in different measurement conditions for each ATR spectrum. Thus, each spectrum has different observation characteristics and cannot be equivalent to the others. In spectroscopic determinations of the properties of samples, every spectrum must have the same observation characteristic except for the properties of the sample. Thus, a chemical image deduced from the Ge ATR method has certain errors due to the non-uniform incident angle distribution.

It is therefore desirable to correct (1) distortion and aberrations, (2) location dependent optical throughput and (3) location dependent incident angle in the chemical images deduced from the Ge hemisphere ATR method. The present invention provides such corrections.

SUMMARY OF THE INVENTION

An embodiment of the invention is a method for correcting a chemical image collected with a germanium hemisphere ATR microscope. A model is developed for rays passing through a simulated germanium (Ge) hemisphere attenuated total reflection (ATR) microscope that includes a simulated Ge hemisphere and a simulated detector at a simulated detector plane. The model determines a data set for rays reaching the detector plane. Movement of the simulated Ge hemisphere is simulated along a first axis between each data set determination. The data sets includes the mean X position of the rays at the sample plane, the mean Y position of rays at the sample plane, and the percentage of rays reaching the detector plane. A background spectrum is measured for rays passing through the center of the Ge hemisphere. A calculated background spectrum is produced by multiplying the percentage of rays by the background spectrum to produce the calculated background spectra at each position. A real Ge hemisphere ATR microscope having parameters that substantially match those of the simulated Ge hemisphere microscope is then used to collect a chemical image of a sample that is in contact with the Ge hemisphere. The collected image is affected by variation in the average incident angle of rays at the sample. Each spectrum in an image is desirably corrected in order to remove this dependence, so that the corrected image is representative only of variations in chemical composition across the sample. A commercial software program such as Thermo Scientific "Advanced ATR Correction" is used for this purpose.

In another embodiment for producing a corrected chemical map, a sequential computation is made for each simulated pixel of a plurality of simulated pixels located at a simulated detector plane. The computation produces a mean X position of a plurality of rays that pass through a germanium (Ge) hemisphere attenuated total reflection (ATR) microscope and of which reach each simulated pixel. The ATR microscope comprises a Ge hemisphere, and the step of sequential computation comprises simulating movement of the Ge hemisphere between each computation at each said simulated pixel. The computation further produces, at each simulated pixel, a mean Y position of the plurality of rays and a percentage of the rays that reach the detector. A background spectrum is measured at the center of the hemisphere. The background spectrum is divided by the percentage to produce a normalized background spectrum for a measurement area at the sample plane. At real pixels at a real detector plane, a spectral image is collected of a sample located at a sample plane that is in contact with the Ge hemisphere. The spectral image is corrected to for variations in the average incident angle to produce a corrected image.

Another embodiment of the invention develops a ray trace model of a germanium hemisphere attenuated total reflection (ATR) microscope to compute image distortion, energy throughput, and average incident angle as a function of position on the sample. A representative optical model of said ATR microscope is built. This optical model includes a list of optical elements of the ATR microscope including their dimensions and relative positions in space. The optical model includes as independent parameters (i) the position of an individual pixel at the detector plane, (ii) the X coordinate of the Ge hemisphere relative to the optical axis of the microscope and (iii) the Y coordinate of the Ge hemisphere relative to the optical axis. The ray trace model traces rays from a source through the microscope to simulate the trajectory of light rays. Traces are made of points on a region of the sample. The ray tracing model, at every point, traces a large number of rays from a single field point through a uniform distribution of points at a pupil plane and rejects all rays from the computation, that would not reach the detector plane. Statistics are computed for rays that reach the detector plane. The statistics include the mean X position of rays incident at the sample plane, the mean Y position of rays incident at the sample plane, the mean incident angle at the sample plane and the percentage of traced rays that reach the detector. The arrays of data are stored as reference data for correcting measured maps. A background spectrum is measured for rays passing through the center of the hemisphere and a calculated background spectrum is produced. A chemical image is collected as an array of ATR spectra over a region of the sample. The spectra are normalized to the computed background spectrum and corrected for incident angle. The normalized spectra are converted to absorption spectra and these are corrected to produce a chemical map which may then be stored and/or displayed.

Embodiments of the invention also include apparatuses to accomplish the methods of the invention. An exemplary apparatus includes a computer having an algorithm that can perform a step of modeling rays passing through a simulated germanium (Ge) hemisphere attenuated total reflection (ATR) microscope, where the simulated Ge hemisphere ATR microscope includes a simulated Ge hemisphere and a simulated detector at a simulated detector plane. The step of modeling rays includes determining a data set for rays reaching the detector plane and, at least once, simulating the movement of the simulated Ge hemisphere along a simulated first axis. The step of determining a data set is repeated. The data set includes the mean X position of the rays at the detector plane, the mean Y position of the rays at the detector plane, the percentage of rays reaching the detector plane, and the background spectrum of rays passing through the center of the Ge hemisphere. The algorithm may include step of producing a calculated background spectrum. The apparatus further includes a real Ge hemisphere ATR microscope having real parameters that substantially match the parameters of the simulated microscope. The real Ge hemisphere ATR microscope includes a real Ge hemisphere and a real detector at a real detector plane. The real detector is configured to collect an image of a sample located at the detector plane and in contact with the Ge hemisphere. A stage is provided for moving the real Ge hemisphere along a real first axis that is substantially similar to the simulated axis. The step of modeling rays may further include an algorithm for correcting spatial distortion of the spectral image to produce a corrected chemical map of the sample. In some cases, a corrected spectral image is substituted for the spectral image in the step of correcting spatial distortion. The data set can also include a mean incident angle of the rays at the location of each position of the sample. This mean incident angle is applied to produce a corrected spectral image, which may include absorption data. Commercial libraries based on ATR spectra are available and provide a solution to the poor match of an ATR spectrum against a transmission library. They can provide an incident angle correction function. A problem with this approach is that the distortions caused by the ATR technique are unique to the optical properties of the ATR device. Therefore, ATR libraries are of most utility when the spectra they contain are obtained on the same accessory used to collect the unknown spectrum to be identified.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Distortion Correction

A way to find the degree of distortion is to measure a sample with a known grid size. Accordingly, imaging data was taken of a polyethylene terephthalate film embossed with a regular pattern of two dimensional square grids. The pattern was composed of 58×58 micron squares with 83 micron pitch in the x and y directions. By measuring this pattern, it would be expected that the IR chemical image would generate 58 micron squares with an 83 micron pitch in the x and y directions. The observed data can then be mathematically corrected to place the observed data points at the real sample points, so far as the same size Ge hemisphere is used in the same imaging microscope.

Energy Throughput

The second problem of the energy throughput profile is also experimentally addressable. Locating the center of the Ge hemisphere to the center of microscope sample stage, setting the imaging area from the center, the optical throughput profile can be reproduced from the pre-measured single beam profile. Since the infrared spectrum is obtained as:

$$R(v) = \frac{I(v)}{I_0(v)} \text{ or } A(v) = -\log_{10} R(v) \quad (1)$$

where $v$ is wavenumber, or the reciprocal of wavelength, (often expressed in $cm^{-1}$). It is typically used as the independent variable in an infrared spectrum. $I(v)$ is the measured response as a function of $v$, when there is a sample on the hemisphere, $I_0(v)$ is the measured response as a function of $v$, when there is no sample. $R(v)$="Reflectance" of sample as a function of wavenumber and $A(v)$ is "Absorbance" of sample as a function of wavenumber. By definition, this is related to the reflectance by the logarithmic function.

$I(v)$ and $I_0(v)$ must be obtained at the same experimental conditions except for the nature of the sample. This is not a problem in the case of transmission and reflection spectroscopy, since only the sample position is changed without changing the optical part of the system. Thus, the background spectrum taken can be used as a common background spectrum for any sample position. However, in the case of ATR imaging using a Ge hemisphere, where the sample is attached to the Ge, the beam path changes by moving the Ge hemisphere and the sample. Thus, each measurement condition is different from sample position-to-position. This implies that the same number of single beam spectra of the system without the sample, $I_0(v)$, must be measured at the same area of interest as the single beam spectra of the system with the sample, $I(v)$. In many imaging experiments, it is not rare to observe a few to over one hundred thousand spectra. Therefore, measurement of background spectra at each position is required, which doubles the measurement time compared with usual transmission and reflection measurements. It would be beneficial for any user, if there is a way to provide all background spectra by measuring a background spectrum at one position. It is possible to achieve this objective by storing the background energy map and normalizing it to the highest energy throughput. Using the stored single beam map, it is possible to calculate the entire single beam map by multiplying the stored map by the single beam spectrum taken at certain reference positions as discussed below.

The observed data can be fitted with (i) relative pixel sensitivity, (ii) quadratic energy intensity inside a sub-group of 16 pixel unit (array) and (iii) overall quadratic energy distribution. In order to calculate a background map from the single measurement of background spectra using an array detector, a single beam map of ±2 mm×±2 mm in both x and y directions are desirably measured. An entire single beam spectra is then divided by the energy level at, for example, 2,000 cm-1 (pixel 8) and a result map is stored as reference map. When the ATR imaging experiment is performed, a set of 16 single beam spectra can be measured with the Ge hemisphere centered under the objective (we define this as the origin of the sample stage, i.e., the 0,0 coordinate). The "single beam map" is computed by multiplying the reference map by the intensities of the 16 single beam spectra at 2000 cm-1.

Incident Angle Distributions

The incident angle distributions may not be experimentally known. Therefore, simulations are performed of the incident angle using a commercially available ray-tracing program such as, but not limited to, ZEMAX. The simulations include modeling of the IR source, Schwarzchild objective, Ge hemisphere, sample and array detector composed of 16 pixels. Because of the optical design of a reflection IR microscope, a mirror is inserted between the IR source and Schwarzchild. This cut the incident beam into two and only one half reaches the Schwarzchild and hence the sample. The totally reflected beam at the boundary between Ge and sample is thus collected by the Schwarzchild and comes back to the mirror and focused on the array detector.

In simulating the incident angle, distortion and optical throughput are calculated. In an exemplary system modeled in the simulation, the Ge hemisphere has a diameter of 12 mm and is inserted into an iN10 MX imaging microscope in the reflection measurement mode. An example Schwarzchild comprises a 15× magnification with a numerical aperture of about, but not necessarily, 0.68. Each array detector element views a 25×25 micron field. In order to model the system, a point source is placed to match the corresponding detector element position in a reflection mode of operation without the Ge hemisphere. An IMAE (image efficiency) command can be used to calculate the efficiency at the detector. Vignetted rays are removed and from the generated rays only the survived ray(s) are counted. In the simulation, the Ge hemisphere is moved 1 pixel in the y-direction and it can be moved by 16 times the pixel size in the x-direction to cover the measurement area. For distortion, commands (i.e., macro commands CENX (centroid x) and CENY (centroid y)) are used to calculate the coordinates of the sample surface where the rays from the sample reached the determined detector element, from both of which the distortion was calculated. The incident angle is then calculated using a Macro programming feature of ZEMAX.

There are a few studies on the incident angle change by moving a Ge hemisphere with a sample. Based on Snell's law, all of these studies discussed the focusing position change produced by displacement of the Ge hemisphere. None of the studies include a Schwarzchild objective and the providers of the present invention noted that the vignetting effect of the Schwarzchild largely deleteriously influenced the incident angle distribution and thus necessitated correction. To illustrate, when the Ge hemisphere is moved away from the incident beam by, for example, 1 mm, the prediction according to Snell's law made by prior art methods is 30.44 degrees incidence for 12.5 mm radius hemisphere. However, rays with such a large incident angle escapes from the Schwarzchild objective without reaching the detector, thus the actual observed incident angle for rays that can be detected is 29.5 degrees. On the other hand, when the Ge hemisphere is moved closer to the incident beam by a distance of, for example again, 1 mm, prior art methods predicts the incident angle is 22.73 degrees for a 12.5 mm radius hemisphere. The embodiments herein provide that it is about 27.5 degrees. The reason for this rather high incident angle can be explained by the understanding that the low incident angle components are all blocked by the secondary mirror of the Schwarzchild objective. The prior art shows that the ATR intensities become large when the Ge hemisphere approaches the incident beam, which is further explained with Snell's law. If the incident angle changes from 30.4 degrees to 22.7 degrees by 2 mm of Ge displacement, the ATR spectral intensities change by about 3.5 times, most often when the sample comprises organic compounds. Results performed herein, show only about 10-15% of intensity changes by Ge hemisphere displacement wherein the ZEMAX simulation provides that the intensity change is about 18% for the displacement from −1 to +1 mm. Thus, the Schwarzchild vignetting effect can often eliminate high incident angles when high incident angles are expected from Snell's law. The Schwarzchild vignetting effect removes low incident angle components when Snell's law predicts low incident angles, making the incident angle change in Ge displacement much smaller than expected. A 15% intensity change in chemical image may provide false information of the sample characteristics. The method of correcting spectra by applying a correction factor based on ray trace modeling considerably reduces this error, resulting in a spectral map that is more representative of the characteristics of the sample.

Figure 4:
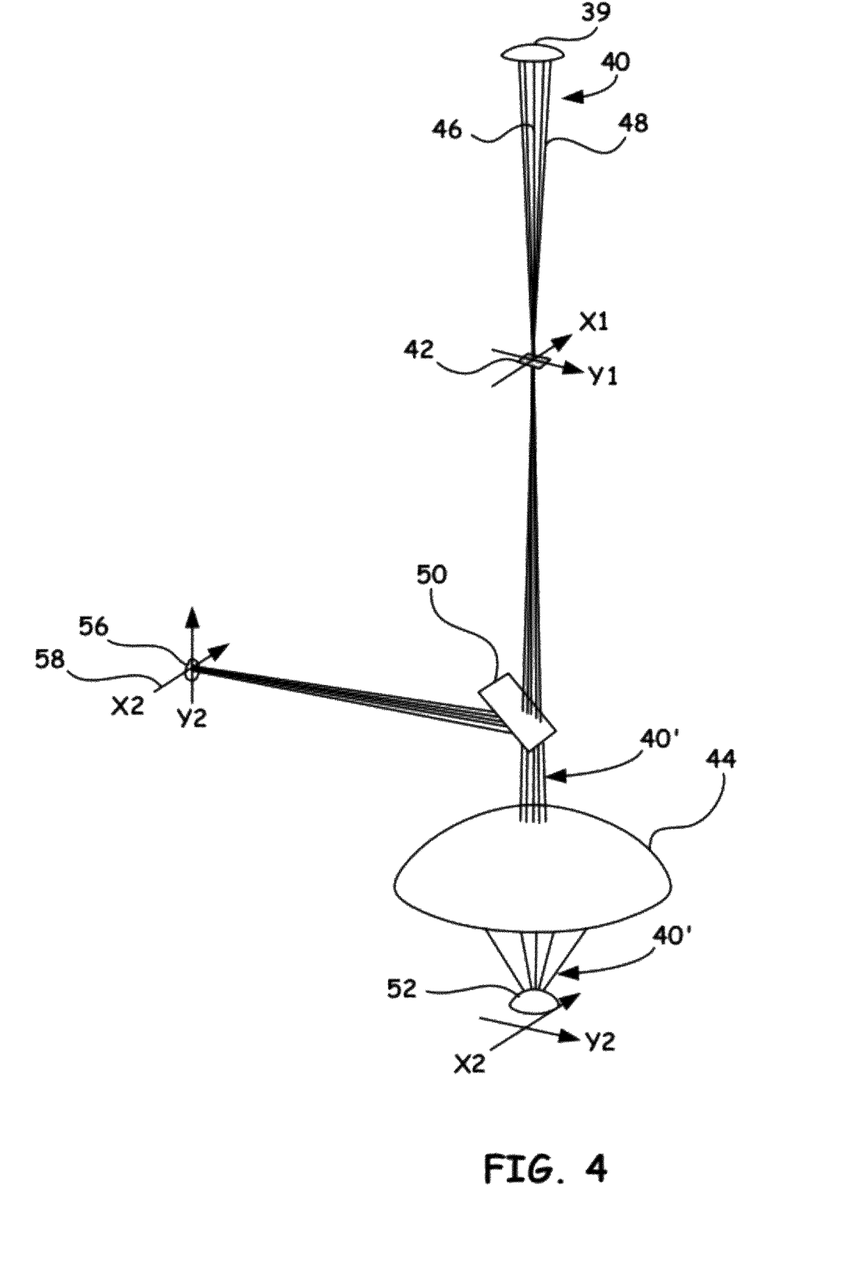
FIG. 4 illustrates rays traced through a germanium ATR microscope.

FIG. 4 illustrates an exemplary instrument to be utilized with the embodiments of the invention. A focused beam 40 configured from one or more optical components 39 is provided from a modulated source (not shown). While a large number of rays are utilized, only 5 example rays of the focused beam 40 are shown for simplicity and ease of reading. The beam illuminates a large area at the "field" plane 42 (also shown with imaging directional arrows labeled X1 and Y1). This is also the back focal plane of the Schwarzchild objective 44. Two sets of exemplary rays are labeled, wherein ray 46 is incident at the center of the field plane and ray 48 is incident at an edge.

Half of the focused beam 40' passes an interposed directional mirror 50, and is focused by the Schwarzchild objective 44 to a sample (not shown) configured at a sample plane denoted as x2, y2, that is in contact with the bottom of a germanium hemisphere 52. The objective often, but not necessarily, is configured with a magnification of about 15×. The overall magnification of the system from the field plane 42 to the sample is up to about fourfold, i.e., by a factor roughly equal to the refractive index of germanium at wavelengths of interest. In total, the system can comprise a magnification of roughly 60× magnification.

Due to the symmetry of the system, rays that reflect from the interface between the germanium hemisphere 52 and a sample (not shown) situated at plane x2, y2, are imaged to a detector plane 56 (now shown with the imaging directional arrows rotated but again labeled x2, y2, with the same magnification factors involved, i.e., about a 1:1 imaging between the field plane 42 and the detector plane 56.

A detector (not shown) at detector plane 56 can often be configured as a linear array of elements, oriented along the x axis (i.e., the arrow labeled 58 with respect to the detector plane 56). In the simulation, points on the detector plane 56 are represented by tracing rays from the corresponding points at the field plane 42. These points are labeled (x1, 0), where the y-coordinate is 0 because the invention models a linear array detector oriented in the x direction. For a 16-element array, 16 "field points" are modeled at field plane 42. This convention is utilized because control of field points is a typical feature of ray tracing software, including, e.g., Zemax. It is to be appreciated that although Zemax is used in this embodiment, those skilled in the art, based on this disclosure, will be able to substitute other ray tracing software (known, as well as newly developed) in the present invention.

At each point (x1, 0), a ray tracing feature, such as that found in Zemax, is used to trace rays through the system. The ray trace can be set up to exclude all rays that can be lost in a physical system, e.g., due to falling outside the clear aperture of an optical component, or falling inside the critical angle of the germanium-sample interface. Zemax as well as other controls the latter with its "polarization ray trace" feature. At each field point, the following statistics are extracted. 1. The mean x position at the sample plane of rays that reach the detector is extracted, using the "CENX" or X-Centroid feature in the merit function editor of Zemax. 2. The mean y position of the rays that reach the detector is extracted, using the "CENY" or Y-Centroid feature in the merit function editor of Zemax. 3. The mean incident angle of the rays that reach the detector is extracted, using a macro written in the Zemax macro language (as exemplified in FIG. 7B), which returns its result through the merit function editor. This macro traces 4000 rays from the field point through a grid of 200×200 points at the primary mirror of the Schwarzchild, and of the rays that reach the detector, computes their angle of incidence at the sample plane. 4. The fraction of rays that reach the detector is extracted, using the IMAE, or "Image Analysis Efficiency" feature in the merit function editor of Zemax, after setting up the Geometric Image Analysis function to trace an effectively point source from the field to the detector.

So far, this discussion has involved no movement of the hemisphere (which holds the sample as well such that the two move together). Without moving the hemisphere, a user can collect a number of spectra equal to the number of elements on the array detector—for definiteness, 16. In a "push broom" imaging microscope, a larger array of spectra are collected by the following process. 1. The sample is moved in a direction perpendicular to the image of the detector array, and 16 spectra are collected at each position of the sample. This builds up a "stripe" of spectra 16 wide, and of arbitrary length. 2. The sample is moved in a direction parallel to the image of the array, and multiple stripes are collected. In this way, a spectral map is collected over an arbitrary area.

A similar "push broom" imaging process works with the Ge hemisphere in place, however, the image is subject to a number of aberrations due to the non-ideal optical behavior of the hemisphere when it is moved off-axis. Some of these aberrations, a description of which follows, correspond to familiar geometrical optical aberrations, while others are unique to the details of ATR. 1. The (x1,y1) points are not linearly mapped to (x2,y2) points. This corresponds to the "distortion" aberration in geometric optics. 2. The off-axis rays pass through the system with diminished efficiency. This corresponds to the "vignetting" effect in geometric optics. 3. The average angle of incidence on the sample affects the relationship between the measured ATR spectrum and the true absorbance spectrum of the sample. This effect is unique to ATR spectroscopy.

Figure 5A:
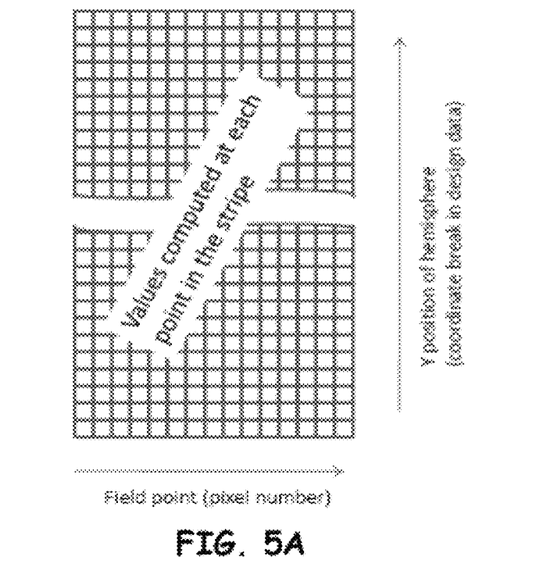
FIG. 5A shows the organization of data points in a segment of a spectral map.
Figure 5B:
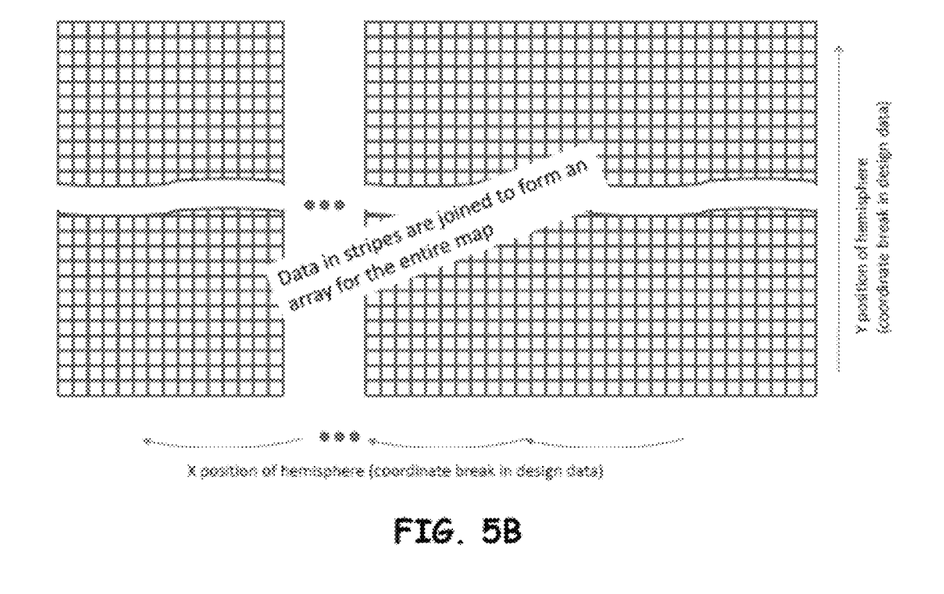
FIG. 5B shows a simulation of a complete map formed by joining segments of the type shown in FIG. 5A.
Figure 6A:
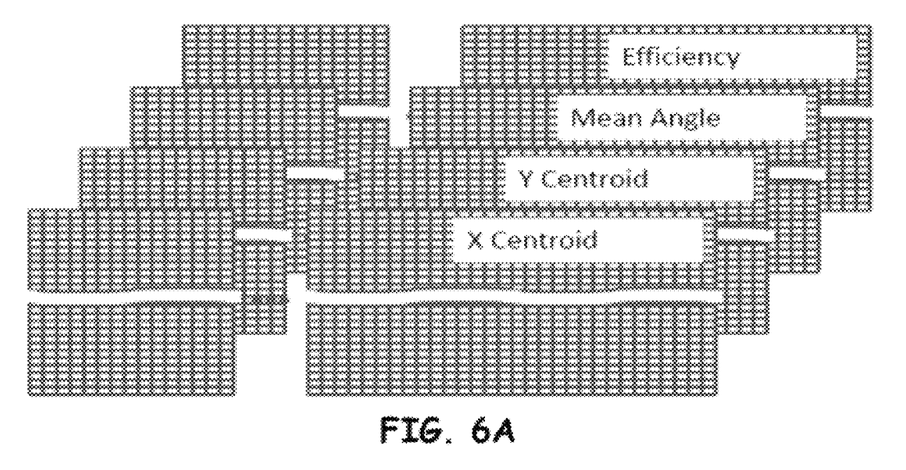
FIG. 6A shows example arrays for each of efficiency, mean angle, Y centroid and x centroid statistic required.
Figure 6B:
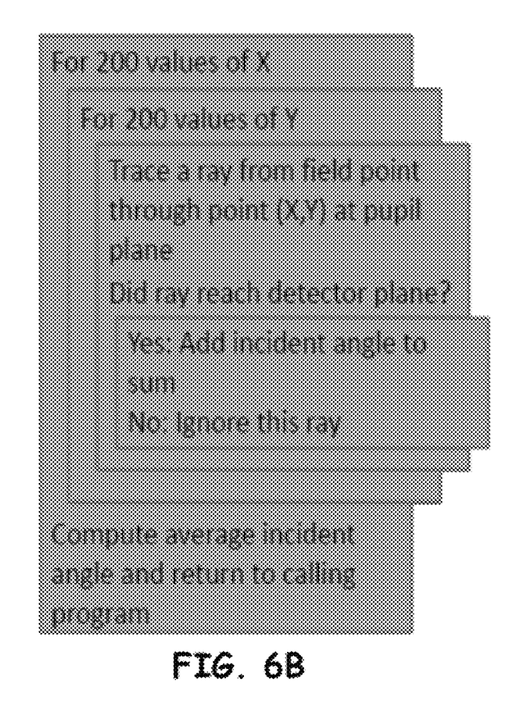
FIG. 6B shows a flowchart for an embodiment macro for computing average incident angle.

The present invention simulates control of a "virtual" microscope in the ray trace program, by controlling the following design parameters within the software. 1. As described above, each detector element is represented by a field point. 2. The X and Y positions of the hemisphere are represented by "coordinate break" elements in the lens data editor of Zemax. The data sets are built up by automating the field point and Y position, and changing the X position of the hemisphere manually in the software, then combining the resulting data sets in an exemplary spreadsheet, e.g., an Excel spreadsheet. 3. Zemax as well as other similar commercial and custom programs has a built-in feature to automate computation of grids, such as, a 2×2 grid of data, called the "3D Universal Plot.", as illustrated in FIG. 5A. This plot feature can generate either a plot or a table of numbers 4. Universal plots are set up with 16 points in the X direction and a number of points in the Y direction corresponding to 1 mm of stage movement, as generally illustrated in FIG. 5B. Plots are generated that correspond to the 4 statistics listed above (i.e., X centroid, Y centroid, mean incident angle, and overall efficiency), as illustrated in FIG. 6A. FIG. 6B shows a flowchart for an embodiment macro for computing average incident angle using 200 values of x and 200 values of y.

Table 1 below provides a flow chart on the steps of an embodiment of the invention.

TABLE 1

| Step | Modeling | Sample measurement | Computation |
|---|---|---|---|
| 1 | Efficiency as a function of position $E_M(x, y)$ M = "Model" | | |
| 2 | | Blank spectrum (no sample) at central position of hemisphere $E_B(x, 0)$ B = "Blank" | |
| 3 | | | Computed values for blank spectra across the entire range of positions $$E_B(x, y) = E_B(x, 0)\frac{E_M(x, y)}{E_M(x, 0)}$$ |
| 4 | | Measured spectra with sample across the entire range of positions $E_S(x, y)$ S = "Sample" | |
| 5 | | | Computed values for measured spectra across the entire range of positions $$T_S(x, y) = \frac{E_S(x, y)}{E_B(x, y)}$$ T = "Transmittance" |
| 6 | Average incident angle as a function of position $\Theta_M(x, y)$ $\Theta$ = "Angle" | | |
| 7 | | | Corrected spectra at each position based on average incident angle for that position $A_S(x, y) = f_{corr}(T_S(x, y), \Theta)$ $f_{corr}$ = "Correction function" A = "Absorbance" |
| 8 | Average x for rays at sample, as a function of x inferred from linear paraxial magnification x'(x, y) y'(x, y) This is effectively a mapping function between (x, y) and (x',y') | | |
| 9 | | | Spectral image, corrected for spatial distortion. Apply inverse of mapping function determined in step 8. Result is a spectral map of absorbance as a function of position on the sample, corrected for the spatial distortion of the imaging process. |

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A method, comprising:
   modeling simulated rays passing through a simulated germanium (Ge) hemisphere attenuated total reflection (ATR) microscope that includes a simulated Ge hemisphere and a simulated detector at a simulated detector plane, wherein said simulated Ge hemisphere ATR microscope comprises simulated parameters, wherein the step of modeling simulated rays comprises:
   determining a data set for rays reaching said simulated detector plane; and
   at least once simulating a movement of said simulated Ge hemisphere along a simulated first axis and determining at least one subsequent data set;
   said method further comprising:
   providing a real Ge hemisphere ATR microscope having real parameters that substantially match said simulated parameters, wherein said real Ge hemisphere ATR microscope comprises a real Ge hemisphere and a real detector at a real detector plane;
   providing a sample to be imaged at said real detector plane, wherein said sample is in contact with said real Ge hemisphere;
   collecting a spectral image of said sample at said real detector plane, wherein said spectral image is collected for actual rays passing through said real Ge hemisphere ATR microscope and reaching said real detector plane, wherein the step of collecting a spectral image comprises at least once moving said real Ge hemisphere along a real first axis that is substantially similar to said simulated first axis and collecting at least one subsequent spectral image at each increment; and
   applying said data set and said at least one subsequent data set to said spectral image and said at least one subsequent spectral image to produce at least one corrected image of said sample.

2. The method of claim 1, wherein said data set and said at least one subsequent data set comprises:
   mean X position of said rays at said simulated detector plane;
   mean Y position of said rays at said simulated detector plane; and
   percentage of rays reaching said simulated detector plane.

3. The method of claim 2, further comprising correcting spatial distortion of said spectral image and said at least one subsequent spectral image to produce a corrected chemical map of said sample.

4. The method of claim 2, wherein the step of applying said data set further comprises correcting spatial distortion of said spectral image to produce a corrected chemical map of said sample.

5. The method of claim 4, wherein said corrected chemical map represents absorption data.

6. The method of claim 4, wherein said data set and said at least one subsequent data set further comprise mean incident angle data of said rays at the location of each position of said sample, wherein the step of correcting said spectral image uses said mean incident angle to produce a corrected spectral image.

7. The method of claim 1, further comprising measuring a background spectrum for rays passing through said real Ge hemisphere ATR microscope.

8. The method of claim 1, further comprising moving, a plurality of times, said simulated Ge hemisphere along a simulated second axis and determining a second data set for rays reaching said simulated detector plane, wherein said simulated second axis is substantially perpendicular to said simulated first axis.

9. The method of claim 8, further comprising moving, a plurality of times, said simulated Ge hemisphere along a second real axis and collecting a plurality of subsequent images, wherein said second real axis is substantially perpendicular to said first real axis.

10. An apparatus, comprising:
    a computer including an algorithm that can perform a step of modeling simulated rays passing through a simulated germanium (Ge) hemisphere attenuated total reflection (ATR) microscope that includes a simulated Ge hemisphere and a simulated detector at a simulated detector plane, wherein said simulated Ge hemisphere ATR microscope comprises simulated parameters, wherein the step of modeling simulated rays comprises:
    determining a data set for rays reaching said simulated detector plane; and
    at least once simulating a movement of said simulated Ge hemisphere along a imulated first axis and determining at least one subsequent data set;
    wherein said apparatus further comprises a real Ge hemisphere ATR microscope having real parameters that substantially match said simulated parameters, wherein said real Ge hemisphere ATR microscope comprises a real Ge hemisphere and a real detector at a real detector plane;
    a sample to be imaged at said real detector plane, wherein said sample is in contact with said real Ge hemisphere;
    collecting a spectral image of said sample at said real detector plane, wherein said spectral image is collected for actual rays passing through said real Ge hemisphere ATR microscope and reaching said real detector plane, wherein the step of collecting a spectral image comprises at least once moving said real Ge hemisphere along a real first axis that is substantially similar to said simulated first axis and collecting at least one subsequent spectral image at each increment; and
    wherein the step of modeling simulated rays further comprises applying said data set and said at least one subsequent data set to said spectral image and said at least one subsequent spectral image to produce at least one corrected image of said sample.

11. The apparatus of claim 10, wherein said data set and said at least one subsequent data set comprises:
    mean X position of said rays at said simulated detector plane;
    mean Y position of said rays at said simulated detector plane; and
    percentage of rays reaching said simulated detector plane.

12. The apparatus of claim 10, further comprising measuring a background spectrum for rays passing through said real Ge hemisphere ATR microscope.

13. The apparatus of claim 10, wherein the step of modeling simulated rays further comprises an algorithm for correcting spatial distortion of said spectral image and said at least one subsequent spectral image to produce a corrected chemical map of said sample.

14. The apparatus of claim 10, wherein the step of applying said data set further comprises correcting spatial distortion of said spectral image to produce a corrected chemical map of said sample.

15. The apparatus of claim 10, wherein said data set and said at least one subsequent data set further comprise mean incident angle data of said rays at the location of each position of said sample, wherein the step of applying said data set and said at least one subsequent data set uses said mean incident angle data to produce said at least one corrected image of said sample.

16. The apparatus of claim 10, further comprising moving, a plurality of times, said real Ge hemisphere along a second real axis, wherein said second real axis is substantially perpendicular to said first real axis.

17. A method, comprising:
modeling an efficiency of simulated rays propagating from a simulated source through a simulated germanium (Ge) hemisphere attenuated total reflection (ATR) microscope onto a simulated detection plane, wherein said efficiency is modeled as a function of an entire range of positions of said simulated rays on said simulated detection plane;
measuring an actual blank spectrum for actual rays propagating on and about a central axis of an actual Ge hemisphere ATR microscope;
computing, using said actual blank spectrum, values for a complete blank spectrum across the entire range of positions on an actual sample plane;
measuring an actual spectrum of an actual sample located at said actual sample plane of said actual Ge hemisphere ATR microscope to produce an image, wherein said actual spectrum is measured across the entire range of positions for said actual rays propagating through said actual Ge hemisphere ATR microscope from an actual source to an actual detection plane;
computing values for a measured spectrum across said entire range of positions;
modeling an average incident angle of said simulated rays reaching said sample;
calculating a correct spectra at each position of a first image;
modeling an average x value for rays at said simulated sample, as a function of x inferred from linear paraxial magnification; and
calculating a spectral image, corrected for spatial distortion.

18. A method, comprising:
developing a ray trace model of a germanium hemisphere attenuated total reflection (ATR) microscope to compute image distortion, energy throughput, and average incident angle as a function of position on a sample, including building a representative optical model of said ATR microscope, wherein said optical model includes a list of optical elements of said ATR microscope with their dimensions and relative positions in space, wherein said optical model includes as independent parameters (i) the position of an individual pixel at a detector plane, (ii) the coordinate of the Ge hemisphere relative to the optical axis of said microscope and (iii) the Y coordinate of the Ge hemisphere relative to the optical axis;
first ray tracing, using said ray trace model, rays from a modulated source to simulate the trajectory of light rays passing through said microscope;
second ray tracing, using said ray trace model, points on a hyperspectral map, wherein the steps of first and second ray tracing comprises:
at every point, tracing a large number of rays from a single field point through a uniform distribution of points at a pupil plane; and
rejecting all rays from the computation, that would not reach the detector plane;
computing arrays of statistics for rays that reach the detector plane, wherein said statistics comprise:
mean X position of rays incident at a sample plane;
mean Y position of rays incident at the sample plane;
mean incident angle at the sample plane; and
percentage of traced rays that reach the detector plane;
storing said arrays of data as reference data for correcting measured maps;
measuring a background spectrum at the center of the hemisphere and calculating background spectra for the entire measurement area to produce a calculated background spectrum by multiplying the background spectrum by the position-dependent calculated energy throughput;
collecting a chemical image as an array of ATR spectra over a region of the sample;
dividing each spectrum of said array of ATR spectra by said calculated background spectrum to produce a normalized spectrum;
correcting said normalized spectrum for variation in incident angle to produce a second normalized spectrum that represents absorption data; and
correcting said second normalized spectrum for spatial distortion to produce a corrected chemical map.

19. A method, comprising:
modeling simulated rays passing through a simulated germanium (Ge) hemisphere attenuated total reflection (ATR) microscope comprising a simulated Ge hemisphere, wherein the step of modeling simulated rays comprises:
determining a data set for rays reaching a simulated detector plane; and
at least once simulating a movement of said simulated Ge hemisphere along a simulated first axis and determining at least one subsequent data set;
wherein said method further comprises providing a real Ge hemisphere ATR microscope;
providing a sample to be imaged at a real detector plane, wherein said sample is in contact with the Ge hemisphere of said real Ge hemisphere ATR microscope;
collecting a spectral image of said sample at said real detector plane, wherein the step of collecting a spectral image comprises at least once moving said real Ge hemisphere along a real first axis that is substantially similar to said simulated first axis and collecting at least one subsequent spectral image at each increment; and
applying said data set and said at least one subsequent data set to said spectral image and said at least one subsequent spectral image to produce at least one corrected image of said sample.

20. An apparatus, comprising:
a computer including an algorithm that can perform a step of modeling simulated rays passing through a simulated germanium (Ge) hemisphere attenuated total reflection (ATR) microscope comprising a simulated Ge hemisphere, wherein the step of modeling simulated rays comprises:
determining a data set for rays reaching a simulated detector plane; and
at least once simulating a movement of said simulated Ge hemisphere along a simulated first axis and determining at least one subsequent data set;
wherein said apparatus further comprises a real Ge hemisphere ATR microscope including a real Ge hemisphere;
providing a sample to be imaged at a real detector plane, wherein said sample is in contact with the Ge hemisphere of said real Ge hemisphere ATR microscope;
collecting a spectral image of said sample at said real detector plane, wherein said collecting the spectral image comprises at least once moving said real Ge hemisphere along a real first axis that is substantially similar to said simulated first axis to collect at least one subsequent spectral image at each increment; and wherein said algorithm is configured to apply said data set and said at least one subsequent data set to said spectral image and said at least one subsequent spectral image to produce at least one corrected image of said sample.

* * * * *